United States Patent
Chen

(10) Patent No.: US 9,184,024 B2
(45) Date of Patent: Nov. 10, 2015

(54) SELECTABLE COULOMB APERTURE IN E-BEAM SYSTEM

(75) Inventor: Zhongwei Chen, San Jose, CA (US)

(73) Assignee: HERMES-MICROVISION, INC., Hsinchu (TW)

( * ) Notice: Subject to any disclaimer, the term of this patent is extended or adjusted under 35 U.S.C. 154(b) by 0 days.

(21) Appl. No.: 13/012,710

(22) Filed: Jan. 24, 2011

(65) Prior Publication Data

US 2011/0192975 A1    Aug. 11, 2011

Related U.S. Application Data

(60) Provisional application No. 61/301,971, filed on Feb. 5, 2010.

(51) Int. Cl.
| | |
|---|---|
| H01J 37/09 | (2006.01) |
| H01J 37/15 | (2006.01) |
| H01J 37/28 | (2006.01) |

(52) U.S. Cl.
CPC ............... *H01J 37/28* (2013.01); *H01J 37/09* (2013.01); *H01J 37/15* (2013.01); *H01J 2237/0453* (2013.01); *H01J 2237/0458* (2013.01)

(58) Field of Classification Search
CPC ........... H01J 37/02; H01J 37/04; H01J 37/09; H01J 37/10; H01J 37/12; H01J 37/14; H01J 37/26; H01J 37/261; H01J 37/28
USPC ........................................ 250/396 R–396 ML
See application file for complete search history.

(56) References Cited

U.S. PATENT DOCUMENTS

| | | | | |
|---|---|---|---|---|
| 5,583,427 | A * | 12/1996 | Teruya et al. | 324/71.3 |
| 5,739,528 | A * | 4/1998 | Kato | 250/251 |
| 5,854,490 | A * | 12/1998 | Ooaeh et al. | 250/492.23 |
| 6,410,924 | B1 * | 6/2002 | Wang | 250/398 |
| 6,576,908 | B1 * | 6/2003 | Winkler et al. | 250/396 R |
| 6,677,592 | B2 * | 1/2004 | Chen | 250/396 R |
| 2003/0155509 | A1 * | 8/2003 | Nakasuji et al. | 250/310 |
| 2007/0057185 | A1 * | 3/2007 | Ichimura et al. | 250/310 |
| 2007/0114410 | A1 * | 5/2007 | Nishiumi et al. | 250/311 |
| 2008/0310704 | A1 * | 12/2008 | Tachibana et al. | 382/148 |
| 2009/0057558 | A1 * | 3/2009 | Iwaya et al. | 250/311 |
| 2009/0256081 | A1 * | 10/2009 | Kaga | 250/396 R |

* cited by examiner

*Primary Examiner* — Jack Berman
*Assistant Examiner* — David E Smith
(74) *Attorney, Agent, or Firm* — WPAT, PC; Justin King

(57) ABSTRACT

A selectable Coulomb aperture in charged particle system comprises a non-magnetic conductive plate with a plurality of holes therein. The plurality of holes has variant sizes or diameters to select different beam currents of primary beam in the charged particle system. The charged particle system may include a charged particle source for emitting a primary beam, a condenser lens for receiving the primary beam and condensing the primary beam, an objective lens for receiving the primary beam and focusing the primary beam on a surface of a specimen. The selectable Coulomb aperture is positioned between the charged particle source and the condenser lens.

19 Claims, 5 Drawing Sheets e-e Interaction Between Gun Aperture and Objective Aperture

| Current Pass Gun Aperture (nA) | Probe Current (nA) | Probe size 2rb (nm) (Full width of 1/e Peak Intensity) | | |
|---|---|---|---|---|
| | | e-e interaction: off | e-e interaction: on | Ratio (on/off) |
| 300 | 25 | 13.88 | 40.19 | 2.90 |
| 250 | | 14.45 | 37.71 | 2.61 |
| 200 | | 14.94 | 34.31 | 2.30 |
| 150 | | 15.29 | 29.96 | 1.96 |
| 100 | | 15.10 | 24.92 | 1.65 |
| 50 | | 15.20 | 18.76 | 1.23 |
| 25 | | 15.00 | 16.60 | 1.11 |

FIG.2

SELECTABLE COULOMB APERTURE IN E-BEAM SYSTEM

CROSS-REFERENCE TO RELATED APPLICATIONS

This application claims the benefit of U.S. Provisional Application No. 61/301,971, filed Feb. 5, 2010 and entitled SELECTABLE SPRAY APERTURE IN E-BEAM SYSTEM, the entire disclosure of which is incorporated herein by reference.

BACKGROUND OF THE INVENTION

1. Field of the Invention

The present invention relates to a charged particle optical apparatus, and more particularly to a SEM with lowered electron-electron interaction.

2. Description of Related Art

Defect inspection of semiconductor wafers and masks for IC manufacturing is an accepted production process for yield enhancement. The information obtained from a wafer defect inspection tool can be used to flag defective dies for repair, or improve wafer processing parameters. The systems used for inspection were typically optical microscopy in nature. However, for imaging of nanoscale objects, optical microscopy has limited resolution since the objects are often much smaller than the wavelength of measuring light. Electron beam systems can have much higher resolution than optical systems because the wavelength of the electron can be in the angstrom regime.

Imaging of an electron beam system are usually carried out using a tightly focused beam (electron probe), the spatial resolution of the system refers to the smallest beam diameter from which spatial information can be obtained. The probe size in general is determined by the electron source size, lens aberrations and electron diffraction at the condenser aperture; however, it can in principle be broadened by Coulomb interactions between the electrons within the electron beam illumination system.

The image resolution of an electron beam system is subject to degradation by lens aberrations. Usually chromatic aberration is the most important factor, since the energy and angular widths of the focused electrons are considerable. Adopting a monochromator or an energy filtered unit to the electron beam system can decrease energy spread of the electron beam and thereafter reduce the chromatic aberration of the system.

However, how to decrease Coulomb interactions between electrons is still an important issue in electron beam system. A conventional solution to this issue is to increase primary beam energy, but landing energy is also increased. If a higher landing energy is not preferred to the practice, a larger retarding force must be applied to the focused primary beam between the objective lens and the specimen, which will incur much more complicated mechanism to the electron beam system. Therefore, the present invention discloses an apparatus to reduce the Coulomb interactions between the electrons and improves the resolution of the electron beam system with a simple and more reliable design.

SUMMARY OF THE INVENTION

One embodiment of the present invention improves resolution of electron beam system by reduces the Coulomb interaction effect within the electron probe. In order to reduce Coulomb effect that broaden the probe size a selectable Coulomb aperture is placing between the gun aperture and the condenser lens to reduce the number of electrons within the electron probe.

Structures of the selectable Coulomb aperture can be one plate with a plurality of openings of variant dimensions. A user or operator can choose a suitable aperture size according to the required beam current.

In one embodiment, a charged particle system comprises a charged particle source for emitting a primary beam, a condenser lens for receiving the primary beam and condensing the primary beam, an objective lens for receiving the condensed primary beam and focusing the primary beam to a surface of a specimen, and means for suppressing charged particle-charged particle interaction of the primary beam.

The means for suppressing charged particle-charged particle interaction comprises a plate with a plurality of holes therein, and the plurality of holes has variant sizes for different currents of the primary beam. The charged particle can be positive or negative.

The means for suppressing charged particle-charged particle interaction comprises a first selectable Coulomb aperture plate between the charged particle source and the condenser lens, and further comprises a second selectable Coulomb aperture plate between the condenser lens and the objective lens. Material of the first and second selectable Coulomb aperture plates are non-magnetic conductive plate.

In another embodiment, this invention provides an electron beam system, which comprises an e-gun for emitting a primary beam, a condenser lens for receiving the primary beam and condensing the primary beam, an objective lens for receiving the condensed primary beam and focusing the primary beam to a surface of a specimen, and an upper selectable Coulomb aperture plate between the e-gun and the condenser lens for suppressing electron-electron interaction of the primary beam.

The electron beam system further comprises a lower selectable Coulomb aperture plate between the condenser lens and the objective lens. Material of the upper selectable Coulomb aperture plate is non-magnetic conductive plate. Material of the lower selectable Coulomb aperture plate is non-magnetic conductive plate. The upper and lower selectable Coulomb aperture plates have two compared holes respectively such that a source current of the primary beam from the upper selectable Coulomb aperture is close to a condensed current of the primary beam.

The upper selectable Coulomb aperture plate comprises variant holes therein for variant currents of the primary beam passing therethrough. The lower selectable Coulomb aperture plate comprises variant holes therein for variant currents of the primary beam passing therethrough. The upper selectable Coulomb aperture plate and the lower selectable Coulomb aperture plate are set two specific holes with closed size respectively such that a source current of the primary beam from the upper selectable Coulomb aperture is close to a condensed current of the primary beam.

This invention also provides a selectable Coulomb aperture for an electron beam system, which comprises a plate with a plurality of holes therein, wherein the plurality of holes with different diameters for trimming different amounts of unnecessary electrons from an electron source of the electron beam system, wherein one aperture of the plurality of holes is positioned between an electron beam source and an objective aperture when the aperture is used. Material of the plate is non-magnetic conductive plate. Material of the plate is platinum, gold, Molybdenum, copper, Tantalum, Platinum-Iridium, or graphite. The Platinum-Iridium has a composition ratio of 95:5.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIG. 2 is a table illustrates simulation result that illustrates the effect of Coulomb interaction between electrons that reflects on the relationship of beam current passing through the gun aperture and the final probe size;

FIG. 3 is a schematic diagram illustrates electrons travel from source to specimen surface for the electron beam system where

DETAILED DESCRIPTION OF THE INVENTION

Figure 1:
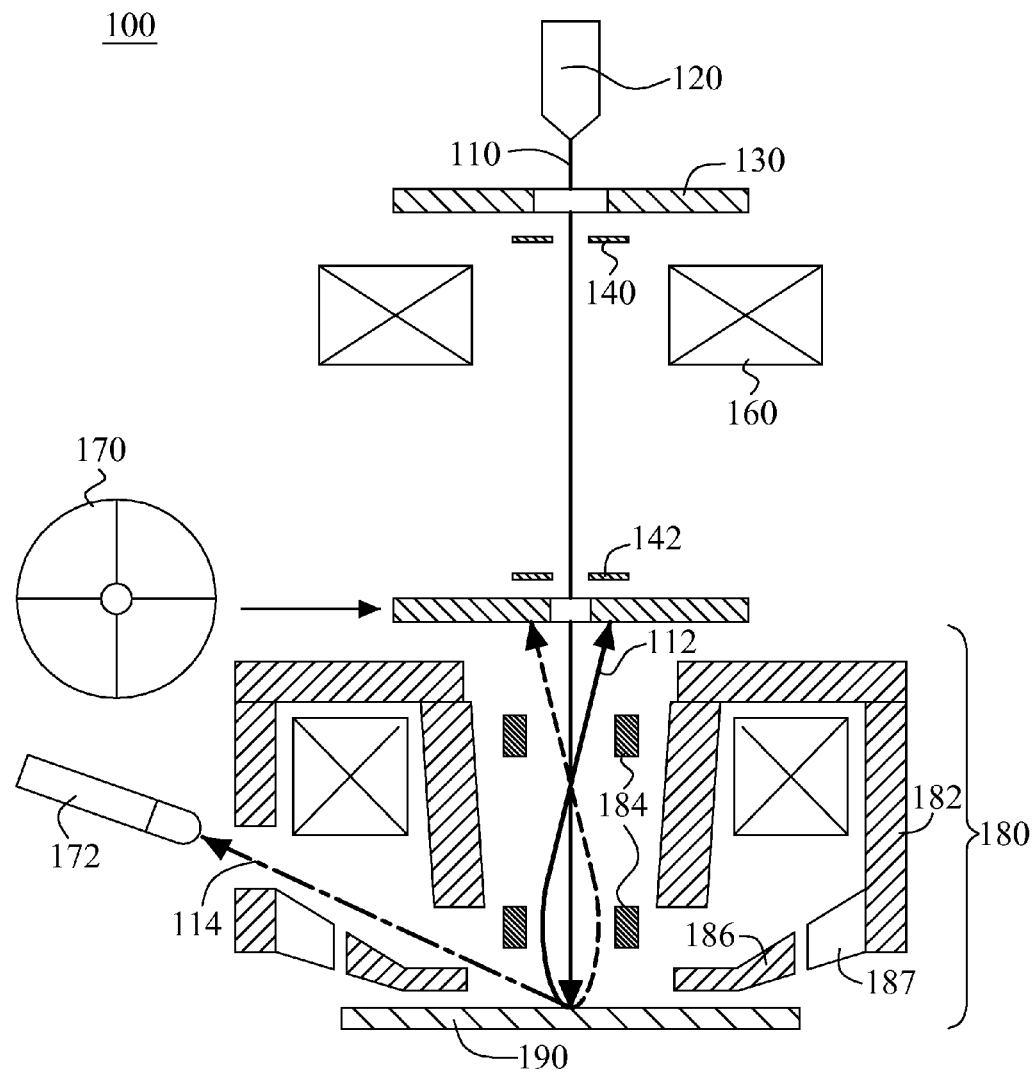
FIG. 1 is a schematic diagrammatic representation of a conventional e-beam inspection system.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

This invention can be applied to any charged particle system, such as FIB (focused Ion Beam) system, AFM (Atomic Force Microscope), or electron beam system, such as E-beam inspection system or SEM (Scanning Electron Microscope), because all charged particle beam have the same charged particle-charged particle interaction issue. All embodiments of this invention will be demonstrated by using electron beam system. Any person skilled in the art will understand all technologies illustrated by the electron beam system can be applied to all positive charged systems.

In this invention, a selectable Coulomb aperture plate is a plate with various holes therein. Holes or apertures in this invention are used alternatively to let a charged beam current pass through. Various holes in this invention have variant sizes to let different charged beam currents pass through. In the original design of aperture is to trim suitable beam current for requirement of the electron beam system. The term, selectable, in this invention means one of various holes can be selected to let a specific charged beam current pass through. It is named Coulomb aperture because it can effectively trim down Coulomb interaction effect within the primary beam.

In this invention, the selectable Coulomb aperture plate is used to decrease electron-electron interaction issue, because different suitable beam currents are applied to different purposes of the electron beam system. If the electron beam system requires a large beam current to inspect a specimen, the aperture with large hole should be provided. On the other hand, if the electron beam system requires a small beam current to inspect a specimen, the aperture with small hole must be provided to decrease electron-electron interaction issues. If the large beam current is still provided in this situation, larger electron-electron interaction will incur more dispersion issue.

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations are not described in detail in order not to unnecessarily obscure the present invention.

FIG. 1 illustrates a conventional electron beam inspection system 100 structure. In a general imaging process, the electron beam 110 emanating from the cathode tip 120 is accelerated by anode 130 voltage, passes through gun aperture 140, condenser lens 160, beam limit aperture 142, and is focused into a inspecting probe by the modified SORIL lens 180, and then impinges onto the sample surface 190. The modified SORIL lens 180 includes magnetic objective lens 182, magnetic/electric deflectors 184, and the modified controlling electrode 186. The secondary electrons 112 emanated from sample surface 190 are collected by the multi-channels detector 170 to form a stereo image of the interest area. For material identification, the X-ray 114 generated from the position that is impinged by the electron beam 110 is collected by energy dispersive spectrometer (EDS) detector 172 to reveal material characteristics.

The resolution of an electron beam system 100 is strongly related to the focused probe size that scanning across the specimen surface 190. It is well known that the Coulomb interaction between electrons will broaden the final probe size. In conventional design, a current limiting aperture 142 is usually configured in front of the objective lens 180 to trim down excess electrons before the electron beam 110 is being final focused. FIG. 2 illustrates a table contains simulated results of probe size variation after considering the Coulomb interaction between electrons. For example, if the primary beam current is set to 300 nano-amperes after passing the gun aperture 140 and the final probe current is set to 25 nano-amperes, the final probe size with count in Coulomb interaction is about 3 times larger than which without count in the Coulomb factor. Another example of Coulomb interaction will affect the final probe size is as following. If the primary beam current after gun aperture 140 is set to be 25 nano-amperes same as the final probe current, then the Coulomb interaction between electrons will not affect much on the final probe size.

One embodiment of the present invention introduces a spread aperture to the electron beam system for improving spatial resolution. The spread aperture 141 can be configured in any position between the gun aperture 140 and the beam limit aperture 142. However, a preferred position is in between the gun aperture 140 and the condenser lens 160. A preferred aperture diameter is the one close to the final probe size diameter. This design can remove redundant electrons and reduces Coulomb interaction within the beam in the early stage of the imaging process. From the result of simulation table, the probe size broadening effect by the Coulomb interaction is insignificant or is tolerant when the primary beam current is set near the final probe current, say two time or 3 times larger. Engineers can select a proper aperture size to drill after consider in the cost of aperture production and tolerant imaging resolution.

Figure 3A:
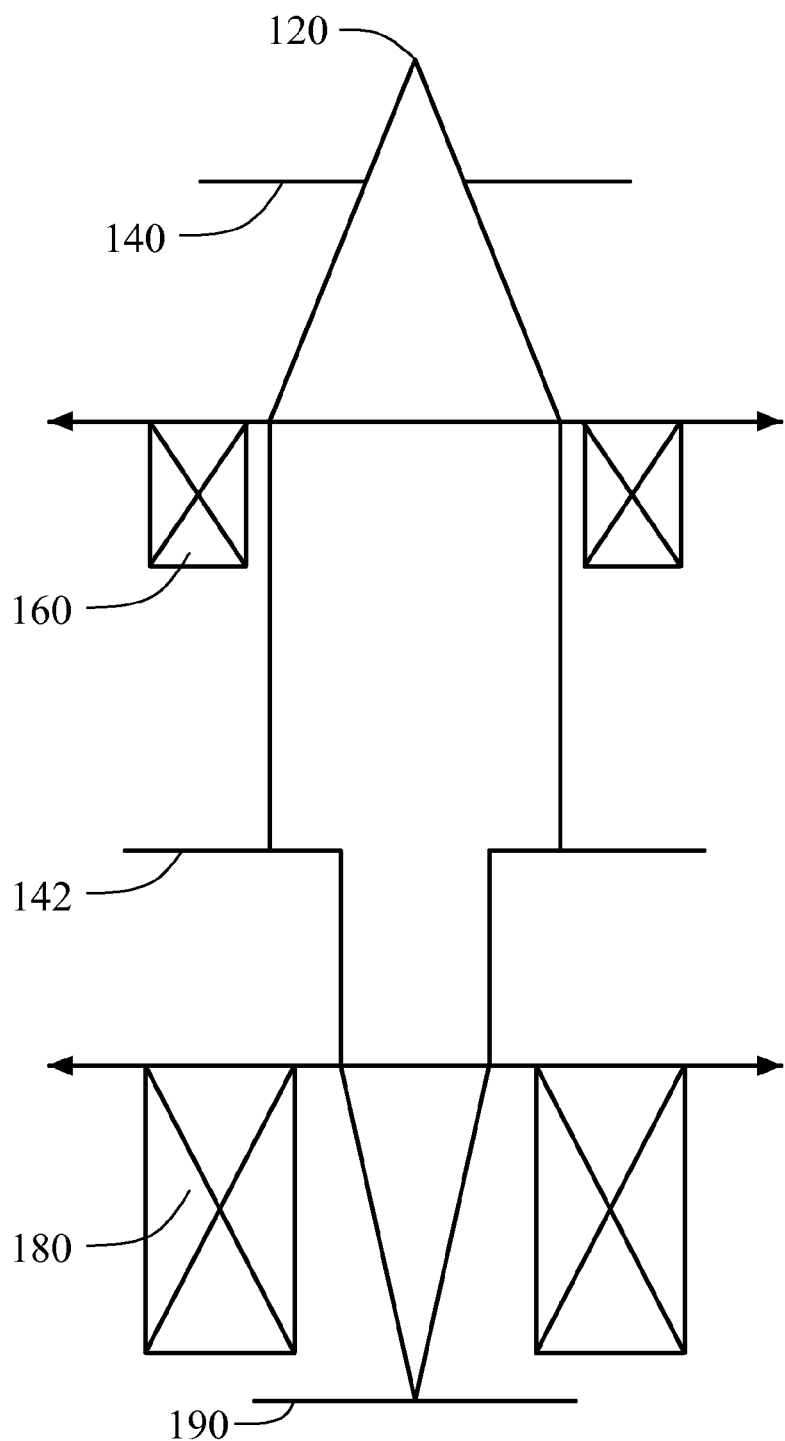
FIG. 3A is a conventional structure and FIG. 3B is a structure of the present invention.
Figure 3B:
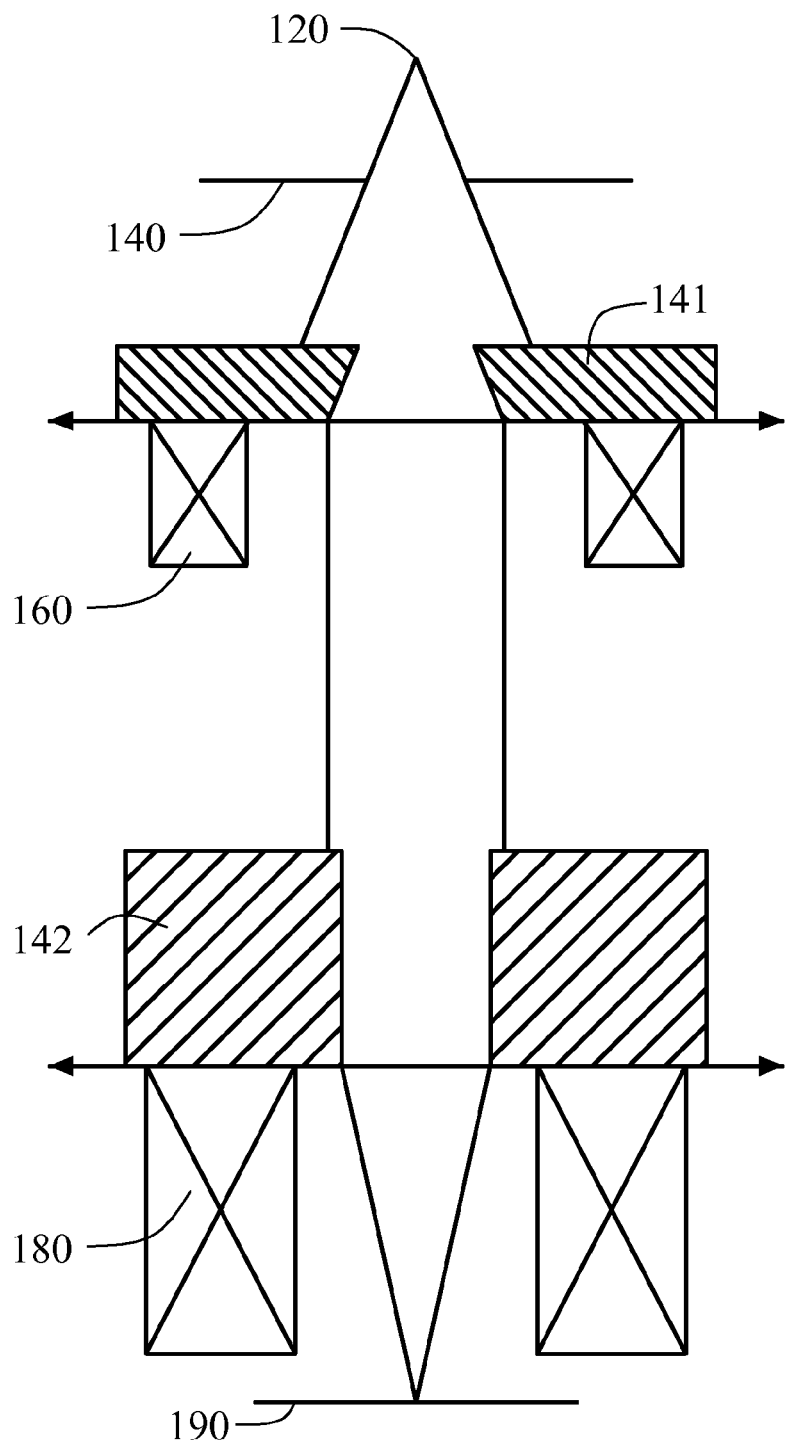

FIG. 3 is a schematic diagram illustrates electrons travel from source 120 to specimen surface 190 for the electron beam system. FIG. 3A is for the conventional electron beam system, FIG. 3B is for the present invention. A Coulomb aperture, in one upper selectable Coulomb aperture plate 141 or called as first selectable Coulomb aperture plate, with at least an opening that can trim down the redundant electrons is configured in front of condenser lens 160. The opening of the aperture is drilled in such a way that the beam current to allows pass this aperture is about the same as final probe current to 2 times larger than the final probe current. Although more than one selectable aperture and be configured between the gun aperture 140 and the current limit aperture 142, however, a preferred aperture is positioned in the space between the gun aperture 140 and the condenser lens 160 with an opening equal or a slightly larger than that of the current limit aperture.

The beam limit aperture above the objective lens 180 can be a lower selectable Coulomb aperture player 142 or second selectable Coulomb aperture plate. If the electron beam system should inspect a specimen with a larger beam current for fast inspection, both the upper selectable Coulomb aperture plate 141 and the lower selectable Coulomb aperture plate 142 can select compared larger holes respectively. If the electron beam system needs to inspect another specimen with a smaller beam current for fine resolution, both the upper selectable Coulomb aperture plate 141 and the lower selectable Coulomb aperture plate 142 should provide compared smaller holes respectively.

Figure 4:
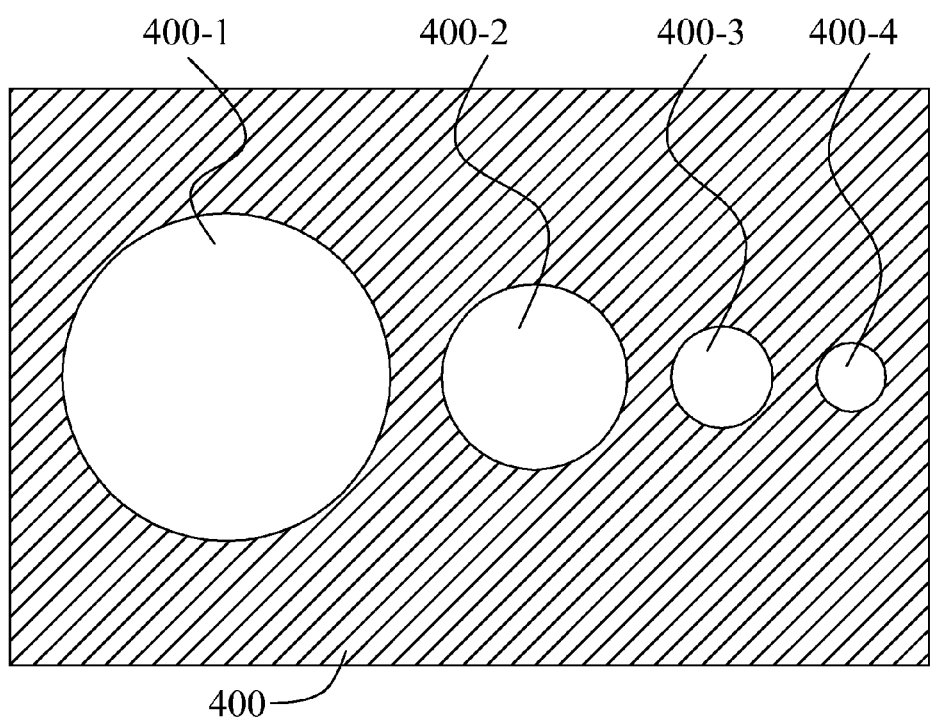
FIG. 4 is a schematic diagram of a selectable spread aperture with multiple opening sizes according to an embodiment of the present invention.

The aperture hole on the selectable Coulomb aperture plate 141 is not limited to one as the FIG. 4 illustrates. More than one dimension aperture holes, such as holes 400-1, 400-2, 400-3, and 4000-4, can be formed in (e.g., drilled on) the selectable Coulomb aperture plate 400. A user or operator can choose a suitable aperture or aperture characteristic to control current required. Selection mechanism can be mechanical and can be designed by any possibility.

Material of the selectable Coulomb aperture plate 141 is or can comprise a non-magnetic, conductive plate, such as one or more of platinum, gold, Molybdenum, copper, Tantalum, Platinum-Iridium (95:5), graphite, or others.

This invention provides means for decreasing charged particle-charged particle interactions in a charged particle beam system, by using at least a selectable Coulomb aperture plate configured in the charged particle beam system.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended.

What is claimed is:

1. A charged particle system, comprising:
a charged particle source with a charged particle source aperture for emitting a primary beam, wherein said charged particle source emits said primary beam through said charged particle source aperture;
a first selectable Coulomb aperture plate comprising a plurality of spread apertures and disposed immediately below the charged particle source aperture, wherein said plurality of spread apertures each has a top opening for receiving said primary beam and a bottom opening, and said top opening is smaller than said bottom opening for reducing Coulomb interaction effect within the primary beam, and said bottom opening has a first width;
a single condenser lens disposed immediately below said first selectable Coulomb aperture plate for receiving the primary beam from said bottom opening, and condensing the primary beam to a first-width straight beam to avoid a crossover;
a second selectable Coulomb aperture plate comprising a plurality of limit apertures and disposed below the single condenser lens for receiving and limiting said first-width straight beam wherein said limit apertures are narrower than said first width for controlling a current of said first-width straight beam and for limiting said first-width straight beam to a second-width straight beam, and said second width is narrower than said first width; and
an objective lens disposed below said second selectable Coulomb aperture plate for receiving the second-width straight beam and focusing the second-width straight beam to a surface of a specimen;
wherein the first selectable Coulomb aperture plate and the second selectable Coulomb aperture plate are for suppressing a charged particle interaction of the primary beam after the primary beam has been emitted through the charged particle source aperture.

2. The charged particle system of claim 1, wherein the second selectable Coulomb aperture plate comprises a plate with a plurality of holes therein.

3. The charged particle system of claim 2, wherein the plurality of holes has variant sizes for different currents of the condensed primary beam.

4. The charged particle system of claim 3, wherein the charged particle is positive.

5. The charged particle system of claim 3, wherein the charged particle is negative.

6. The charged particle system of claim 1, wherein material of the first and second selectable Coulomb aperture plates are non-magnetic conductive plate.

7. The charged particle system of claim 1, wherein said first selectable Coulomb aperture plate is thinner than said second selectable Coulomb aperture plate.

8. The charged particle system of claim 1, wherein said first selectable Coulomb aperture plate comprises a selected aperture size to allow a beam current at a first nA to pass through, wherein said first nA is between a final probe current nA to twice said final probe current nA.

9. An electron beam system, comprising:
an e-gun with a gun aperture for emitting a primary beam, wherein said e-gun emits said primary beam through said gun aperture;

an upper selectable Coulomb aperture plate with a plurality of spread apertures below the gun aperture, for suppressing electron-electron interaction of the primary beam and for reducing Coulomb interaction effect within the primary beam, wherein said plurality of spread apertures each has a top opening for receiving said primary beam and a bottom opening, and said top opening is smaller than said bottom opening, and said bottom opening has a first width;

a single condenser lens disposed immediately below said upper selectable Coulomb aperture plate for receiving the primary beam from said bottom opening, and condensing the primary beam to a first-width straight beam to avoid a crossover;

a lower selectable Coulomb aperture plate with a plurality of limit apertures below the single condenser lens for receiving and limiting the first-width straight beam, wherein said limit apertures are narrower than said first width for controlling a current of the first-width straight beam and limiting said first-width straight beam to a second-width straight beam, and said second width is narrower than said first width; and an objective lens disposed below said lower selectable Coulomb aperture plate for receiving the second-width straight beam and focusing the second-width straight beam to a surface of a specimen.

10. The electron beam system of claim 9, wherein material of the upper selectable Coulomb aperture plate is non-magnetic conductive plate.

11. The electron beam system of claim 10, wherein material of the lower selectable Coulomb aperture plate is non-magnetic conductive plate.

12. The electron beam system of claim 10, wherein the upper and lower selectable Coulomb aperture plates have two compared holes respectively such that a source current of the primary beam from the upper selectable Coulomb aperture plate is close to the current of the primary beam after the lower selectable Coulomb aperture plate, wherein the compared holes are nearly equivalent in size.

13. The electron beam system of claim 9, wherein the upper selectable Coulomb aperture plate comprises variant holes therein for variant currents of the primary beam passing therethrough.

14. The electron beam system of claim 13, wherein the lower selectable Coulomb aperture plate comprises variant holes therein for variant currents of the condensed primary beam passing therethrough.

15. The electron beam system of claim 14, wherein two specific holes with closed size are set on the upper selectable Coulomb aperture plate and the lower selectable Coulomb aperture plate respectively such that a source current of the primary beam from the upper selectable Coulomb aperture plate is close to the current of the primary beam after the lower selectable Coulomb aperture plate.

16. A selectable Coulomb effect reduction device for an electron beam system, comprising:

a first plate with a plurality of spread apertures therein, positioned between an electron beam source aperture and a single condenser lens, and immediately above the single condenser lens, by a first mechanical selection mechanism, for reducing a Coulomb interaction effect by trimming electrons from an electron beam, wherein said plurality of spread apertures each has a top opening for receiving said electron beam and a bottom opening, and said top opening is smaller than said bottom opening, and said bottom opening has a first width said single condenser lens receives said electron beam from said bottom opening to condense said electron beam to a first-width straight beam to avoid a crossover; and a second plate with a plurality of limit apertures therein, positioned between the single condenser lens and an objective lens, and close to the objective lens, by a second mechanical selection mechanism, for controlling a current of the electron beam to reach a specimen, wherein said limit apertures are narrower than said first width for controlling a current of the first-width straight beam and limiting said first-width straight beam to a second-width straight beam, and said second width is narrower than said first width.

17. The selectable Coulomb aperture of claim 16, wherein material of the plate is non-magnetic conductive plate.

18. The selectable Coulomb aperture of claim 16, wherein material of the plate is platinum, gold, Molybdenum, copper, Tantalum, Platinum-Iridium, or graphite.

19. The selectable Coulomb aperture of claim 18, wherein the Platinum-Iridium has a composition ratio of 95:5.

\* \* \* \* \*